US005869767A

United States Patent [19]

Hayward et al.

[11] Patent Number: 5,869,767

[45] Date of Patent: Feb. 9, 1999

[54] ULTRASONIC TRANSDUCER

[75] Inventors: Gordon Hayward, Balfron; David James Powell, Haddington, both of Scotland

[73] Assignee: University of Strathclyde, Glasgow, Scotland

[21] Appl. No.: 919,750

[22] PCT Filed: Dec. 13, 1993

[86] PCT No.: PCT/GB93/02538

§ 371 Date: Oct. 30, 1995

§ 102(e) Date: Oct. 30, 1995

[87] PCT Pub. No.: WO94/13411

PCT Pub. Date: Jun. 23, 1994

Related U.S. Application Data

[63] Continuation of Ser. No. 454,202, Oct. 30, 1995, abandoned.

[30] Foreign Application Priority Data

Dec. 11, 1992 [GB] United Kingdom .................. 9225898

[51] Int. Cl.[6] .............................. G01L 1/00; H01L 41/04; H01L 41/08; H01L 41/18

[52] U.S. Cl. ............................ 73/774; 310/358; 310/334; 310/345; 310/800

[58] Field of Search ............................ 73/628, 641, 774; 310/345, 334, 358, 800

[56] References Cited

U.S. PATENT DOCUMENTS

| | | | |
|---|---|---|---|
| 3,853,805 | 12/1974 | Miller et al. | 260/37 B |
| 4,023,054 | 5/1977 | Taylor | 73/774 |
| 4,227,111 | 10/1980 | Cross et al. | 310/358 |
| 4,354,132 | 10/1982 | Borburgh et al. | 310/334 |
| 4,359,726 | 11/1982 | Lewiner et al. | 340/666 |
| 4,383,194 | 5/1983 | Ohigashi et al. | 310/326 |
| 4,412,148 | 10/1983 | Klicker et al. | 310/358 |
| 4,434,384 | 2/1984 | Dunnrowicz et al. | 310/325 |
| 4,443,730 | 4/1984 | Kitamura et al. | 310/330 |
| 4,658,176 | 4/1987 | Nakaya et al. | 310/334 |
| 4,683,396 | 7/1987 | Takeuchi et al. | 310/358 |
| 4,701,659 | 10/1987 | Fujii et al. | 310/334 |
| 4,783,888 | 11/1988 | Fujii et al. | 29/25.35 |
| 4,786,837 | 11/1988 | Kalnin et al. | 310/364 |
| 4,933,230 | 6/1990 | Card et al. | 428/242 |
| 4,963,782 | 10/1990 | Bui et al. | 310/358 |
| 5,115,809 | 5/1992 | Saitoh et al. | 128/662.03 |
| 5,175,709 | 12/1992 | Slayton et al. | 367/90 |
| 5,288,551 | 2/1994 | Sato et al. | 428/334 |
| 5,334,903 | 8/1994 | Smith | 310/358 |
| 5,406,163 | 4/1995 | Carson et al. | 310/334 |
| 5,431,058 | 7/1995 | Lagier et al. | 73/774 |

FOREIGN PATENT DOCUMENTS

| | | |
|---|---|---|
| 29 14 031 | 5/1980 | Germany . |
| 34 41 563 | 5/1985 | Germany . |

OTHER PUBLICATIONS

Abstract–"Ultrasonic Probe and its Manufacture", Nakatani Chitose et al, vol. 12, No. 329, Patent No. JP63090759, Apr. 21, 1988.

*Primary Examiner*—Hezron Williams
*Assistant Examiner*—Richard A. Moller
*Attorney, Agent, or Firm*—Bell Seltzer Intellectual Property Law Group of Alston & Bird LLP

[57] ABSTRACT

An ultrasonic transducer (10) comprises a flexible transmitter (18), a flexible receiver array (22), and flexible electrodes (14), (16), (20), for the transmitter and receiver. The elements of the transducer are arranged such that the transducer may be flexed for conformity with surfaces of test specimens of a variety of non-planar configurations.

5 Claims, 2 Drawing Sheets

ULTRASONIC TRANSDUCER

This application is a continuation, of application Ser. No. 8/454,202, filed Oct. 30, 1995 now abandoned.

FIELD OF THE INVENTION

This invention relates to ultrasonic transducers, and in particular to ultrasonic transducers for use in conjunction with non-planar test specimens. In addition, the invention relates to a piezo-electric composite for use in such transducers.

DESCRIPTION OF THE PRIOR ART

Ultrasonic transducers are typically rigid devices due to the inherent physical properties of most piezo-electric materials, such as the PZT family and lead metaniobate. These ceramic materials are normally employed in the construction of piezo-electric devices owing to their high electro-mechanical coupling coefficient although they are not ideally suited for applications operating into a fluid medium or through a couplant material, due to acoustic mismatch. However, there is another family of piezo-electric materials, including the polymer polyvinylidene fluoride (PVDF), that possess the necessary properties for good electrical matching for operation in fluid based media, moreover they also offer a high degree of physical flexibility. Additionally, PVDF, due to its electrical properties, may provide high bandwith reception properties when operating into a very high input impedance receiver. However such materials are less sensitive than their piezo-electric ceramic counterparts.

In efforts to provide an improved ultrasonic transducer, ideally incorporating the favourable properties of both forms of piezo-electric materials, piezo-electric composites have been developed. Such composites consist of an array of piezo-ceramic rods embedded within a polymer matrix, manufactured using a ‘dice and fill’ process; a sheet of ceramic is cut longitudinally and transversely to produce a plurality of square pillars which are then spaced apart and located in the polymer matrix. In such composites, the application of an electric, or pressure field causes the ceramic rods to vibrate, the surrounding polymer moving with the rods to give the appearance of a homnogeneous material. This combination of materials serves to provide reduced acoustical impedance properties when compared to pure ceramic and has increased electro-mechanical sensitivity.

Various polymer fillers have been adopted to fabricate such piezo-electric composites, and the use of flexible composites has allowed the forming of curved ultrasonic devices, which may be used to provide good coupling Of acoustic energy between the ultrasonic devices and test specimens, such as pipes, with correspondingly curved surfaces. However, efforts to provide flexible ultrasonic devices which are capable of reliable use with test specimens of a variety of curvatures have, as yet, proved unsuccessful.

It is an object of the present invention to provide a flexible ultrasonic transducer suitable for use in conjunction with non-planar test specimens.

SUMMARY OF THE INVENTION

According to the present invention there is provided a flexible ultrasonic transducer for use with test specimens of a variety of curvatures, the transducer including a flexible transmitter in the form of a piezo-electric composite comprising a combination of active piezo-ceramic elements embedded within a flexible substrate and mounted on a flexible stiffening layer, a flexible receiver array, and flexible electrodes for the transmitter and receiver.

Preferable also, the transmitter and receiver may be integral but are preferably separate, and most preferably the transmitter is located upwardly of the receiver, that is further from the face of the transducer for contact with the test specimen.

The transmitter is of a piezo-electric composite, which most preferably forms a single transmit element for good transmission sensitivity. Such piezo-electric composites comprise a combination of active piezo-ceramic elements embedded within a passive polymer phase. The elements may be of any suitable form, the dimensions tending to be a compromise between desired flexibility and ease of manufacture. The elements may be in the form of rods but preferably are in the form of platelets having a width:height aspect ratio such that each element of the transmitter acts in a similar manner to a small thickness mode resonator. Conventionally, it is understood that for a material to be treated as a purely thickness mode device it must possess a width:height aspect ratio in excess of 10:1. However, for an operating frequency of 3–5 MHz, the required piezo-ceramic thickness is about 0.5 mm, requiring platelet cross-sectional dimensions in excess of 5.0 mm, and significantly reducing the flexibility of such a device. Surprisingly, it has been found that the platelet's width:height aspect ratio ray be as low as 5:1 and still provide results in close agreement with analytical results obtained from a thickness mode transduction model. Thus, with appropriate choice of platelet dimensions it is possible to provide a flexible piezo-electric material that possesses the electro-mechanical properties of the parent ceramic.

Preferably also, the platelet-based piezo-electric composite is bonded to a relatively stiff circuit board, which has been found to reduce many of the spurious modes lying between the lateral and fundamental thickness modes. Conveniently, the circuit board forms an electrode for the composite.

As typical piezo-electric composites are relatively thick, in the order of 100's of microns compared to 10's of microns for piezo-polymers such as PVDF, the surfaces of a piezo-electric composite transmitter are a significant distance from its mechanical neutral axis and thus, when the transducer is flexed, the surfaces of the composites stretch and contract to a significant degree. Accordingly, the transmitter electrodes, and in particular the upper transmitter electrode, is preferably of a resilient conductive material which may be flexed without cracking or delaminating from the transmitter. It has been found that a suitable materials for use in forming such an electrode include flexible polymers containing or carrying conductive particles or fibres, such as carbon-loaded PTFE. Alternatively, a silver loaded silicon impregnated carbon fibre electrode may be utilised. Such electrodes provide A high degree of electrical conductivity and will be readily flexed when the transducer is placed on test specimens of different surface configurations, without cracking or delaminating from the transmitter. The provision of a more flexible electrode material also allows the electrode to be thicker, and thus have higher conductivity. Where the transducer is intended only for use with curved test specimens it may only be necessary to provide an electrode having these properties on the upper face of the composite transmitter; the lower transmitter electrode, and the electrodes for the receiver may be formed of traditional electrode material with limited flexibility. Most preferably, the lower transmitter electrode is of a relatively soft metal, such as copper or aluminium.

Preferably, the receiver array is formed of a single sheet of flexible piezo-electric material, such as PVDF, which has been etched to define an array of receive elements.

Preferably also, the transmitter and receiver are located on opposite sides of a supporting substrate, for example in the form of a PCB. Most preferably, the substrate is plated with a suitably conductive material, such as copper, to provide electrodes. The conductive layer adjacent the receiver array is most preferably etched to define suitable receive element electrodes.

Most preferably, the lower face of the transducer is provided with a protective coating, such as a polyamide layer.

Also, a matching layer may be provided between the lower face of the transducer and the receiver to improve the transducer performance into particular test specimens.

According to a further aspect of the present invention there is provided a piezo-electric composite comprising a plurality of piezo-ceramic platelets carried by a flexible substrate.

Preferably, the platelets have a width:height aspect ratio of at least around 5:1.

BRIEF DESCRIPTION OF THE DRAWING

These and other aspects of the present invention will now be described, by way of example, with reference to the accompanying drawings, in which.

DESCRIPTION OF THE PREFERRED EMBODIMENTS

Figure 1:
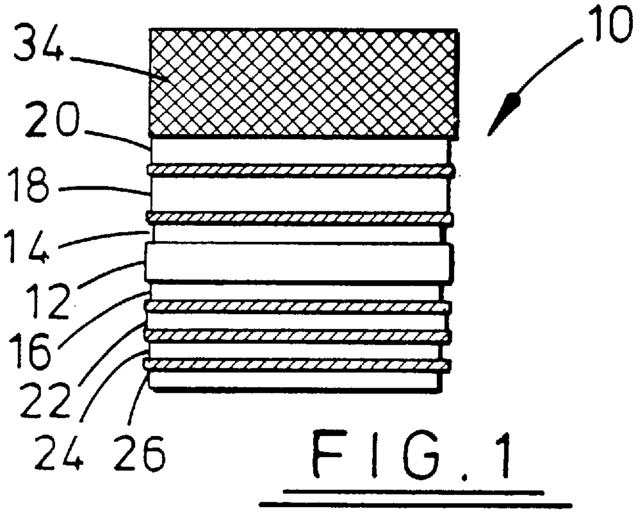
FIG. 1 is a somewhat schematic sectional view of an ultrasonic transducer in accordance with a first embodiment of the present invention.

Reference is first made to FIG. 1 of the drawings, which shows, somewhat schematically, a section through an ultrasonic transducer 10 in accordance with a preferred embodiment of the present invention. In this particular example the transducer 10 comprises various elements adhered to a PCB core 12 provided with copper cladding 14, 16 on both upper and lower sides. As will be described, the upper layer of copper 14 provides an electrode for a transmitter 18, a further transmitter electrode 20 being provided on the upper face of the transmitter 18. The lower copper cladding 16 is etched to provide electrodes for a receiver array 22, the lower face of the array 22 being provided with a matching layer 24 and a protective layer 26 which contacts the surface of a test specimen when the transducer is in use.

The transducer 10 is intended for use in conjunction with non-planar, and in particular curved test specimens and as such the transducer 10 must be flexible and, accordingly, the various elements of the transducer must possess varying degrees of flexibility and resilience.

The PCB core 12 is of a polyamide such as Kapton (RTM) and the fairly limited degree of flexing experienced by the core 12 is also accommodated by a limited stretching and contraction of the copper cladding 14, 16. In this particular example the core 12 is 64 microns thick, while the copper layers 14, 16 are each 16 microns thick, and the core 12 is rectangular of length and width 40 and 20 mm. The other layers of the transducer 10 are affixed to one another by layers of suitable adhesive, in this example 6 micron thick layers of low viscosity epoxy adhesive.

Figure 2:
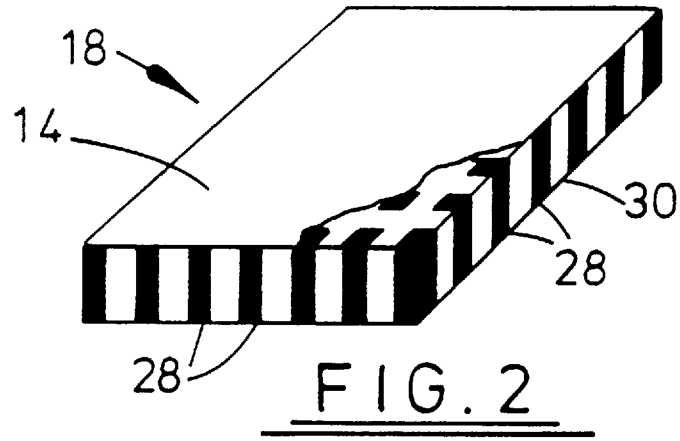
FIG. 2 is a perspective view, from below, of a composite transmitter of the transducer of FIG. 1.

The transmitter 18 is formed of piezo-electric composite, as illustrated in FIG. 2 of the drawings, which includes an array of piezo-ceramic rods 28 embedded within a polymer matrix 3, using a "dice and fill process". As the composite transmitter 18 is relatively thick, and this example being between 0.1 mm and 1 mm thick, the upper surface of the transmitter 18 is a significant distance from its mechanical neutral axis. Thus, when the transducer 10 is flexed to conform with a curved test specimen surface, the upper surface of the composite stretches and requires the electrode 20 to act likewise. Accordingly, the electrode 20 must be more flexible than the lower, copper transmitter electrode 14 and, in this example, is formed of a layer of carbon-loaded PTFE, such as the carbon loaded Gore-TeX (RTM) which is available from W L Gore & Associates (UK) Limited, of Dunfermline, Scotland. The electrode 20 is typically between 1 and 2 mm thick, with a resistance of around 4–5 ohms. The lower transmitter electrode 14, being of relatively soft metal, acts to equalise the heave and fall of the rods 28 of the transmitter.

The receiver 22 is formed of a piezo-polymer, in this example a single layer of PVDF, which has been etched to define a total of 80 receive elements. The copper cladding 16 which forms an upper electrode for the receiver 22 is similarly etched to define appropriate electrodes for the receive elements. For a transducer array the spatial sampling rate is determined by the receive element centre-to-centre spacing. To avoid diasing problems following image reconstruction, the centre-to-centre spacing should ideally be half a wavelength or less. For operation at around 3 MHz this leads to the selection of a spacing of 0.25 mm, to allow operation into water.

In this example the matching layer 24 is formed of 20 micron thick aluminium to provide matching for operation into steel specimens. The protective layer 26 is formed of a 25 micron thick layer of Kapton.

Figure 3:
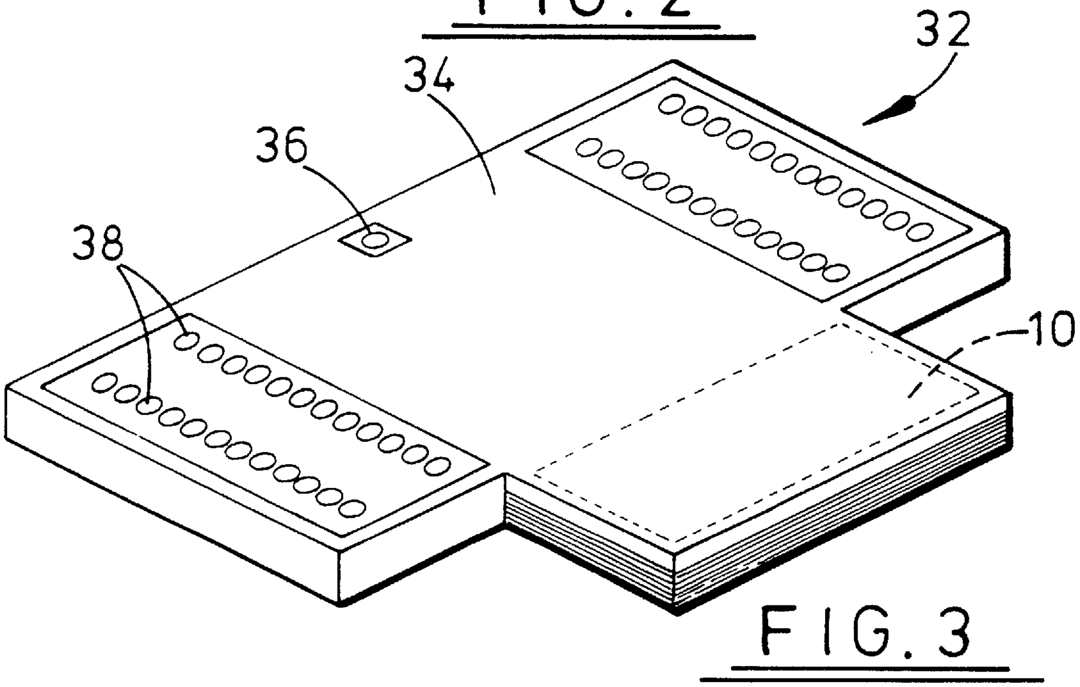
FIG. 3 is a perspective of a device including the transducer of FIG. 1.
Figure 4:
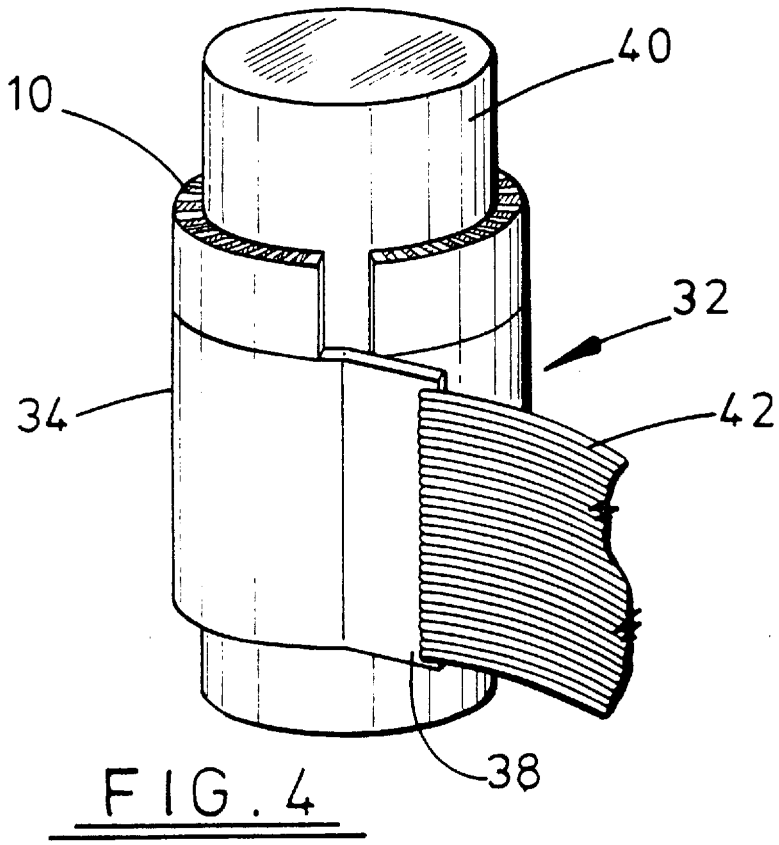
FIG. 4 is a perspective view of the device of FIG. 3 in use on a cylindrical test specimen.

The transducer 10 may be used to form part of a transducer device 32, such as illustrated in FIGS. 3 and 4 of the drawings. Referring in particular to FIG. 3, the device 32 is generally of a T-shape and comprises a polyurethane rubber body 34 into which the transducer 10 is embedded, the transducer 10 being located in the leg of the T. Connecting electrodes (not shown) extends through the body 34 from the transducer 10 to a single transmitter connection 36 and an appropriate number (80) of receive element connections 38.

FIG. 4 illustrates the device 32 wrapped around a cylindrical test specimen 40 and with the lower face of the transducer 10 in contact with the surface of the specimen. It will be noted that the drawing also illustrates connecting wires 42 extending from the connections 36, 38 to an appropriate control unit (not shown).

In an alternative embodiment, the carbon-loaded PTFE transmitter electrode 20 may be replaced by a carbon fibre stranded matting impregnated with silver loaded silicon. This electrode is created by placing the carbon fibre matting over the transmitter 18 and then loading the matting with electrically conductive silver loaded silicon resin material which seeps through the mat to provide adherence to the transmitter 18. This provides a rather thick layer with a rough surface finish, which is then lapped down to a more appropriate thickness (around 0.5 mm).

It has been found that transducers as described above may be used to locate internal flaws in curved pipes, and tests with 75 mm radius steel pipe with a wall thickness of 35 mm have clearly identified internal notch and slot flaws.

Figure 5:
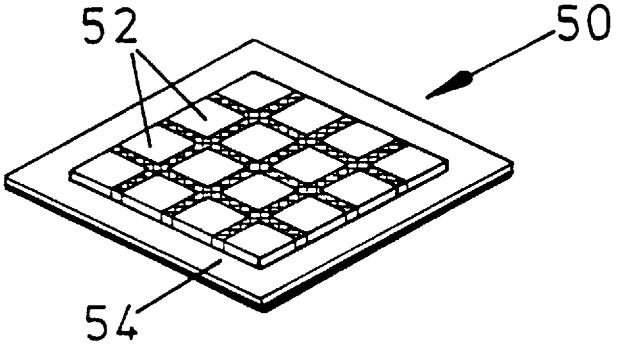
FIG. 5 is a perspective view of a transmitter of a transducer in accordance with another embodiment of the present invention.

Reference is now made to FIG. 5 of the drawings, which illustrates the transmitter 50 of a transducer in accordance with another embodiment of the present invention. In contrast to the first described embodiment, this transmitter 50 comprises piezo-ceramic platelets 52 embedded in a flexible polymer substrate 54: for high frequency applications (3–5 MHz), it is difficult to satisfy the prerequisite for fine spatial scales with rods due to manufacturing constraints. FIG. 5 illustrates a transmitter 50 comprising platelets 52 made from PZT-5A with dimensions 0.5×2.5×2.5 mm. A thin (100 micron) flexible copper clad board is bonded to one face of the composite, and reduces many of the spurious modes lying between the lateral and fundamental thickness modes.

Figure 6:
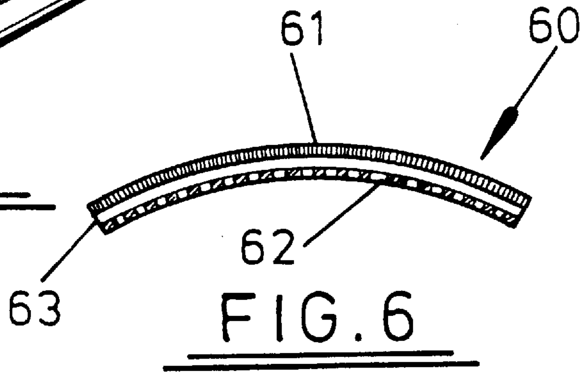
FIG. 6 is a sectional view of a transmitter of a transducer in accordance with a further embodiment of the present invention.

Reference is now made to FIG. 6 of the drawings, which illustrates a transmitter 60 formed of modified lead titanate (MPT) platelets 61 in a flexible polymer substrate, such a composite demonstrating a significantly reduced lateral coupling co-efficient over that of a PZT-5A composite.

Tests have indicated that transducer structures incorporating such platelet composites may be simulated accurately by a thickness mode transduction model. The ultimate choice of platelet dimensions is a compromise between desired flexibility and ease of manufacture however it has been found that there is a lower limit (5:1) to the platelet's width:height aspect ratio for correspondence with-such a model.

With appropriate choice of platelet dimensions, as will be readily apparent to the skilled person, the composite provides a flexible piezo-electric material that possesses the electro-mechanical properties of the parent ceramic, suitable for large aperture applications where the response of the individual platelets may be effectively integrated together.

In the example illustrated in FIG. 6, a large aperture MPT platelet composite transmitting element 61 is coupled to a monolithic, highly spatially sampled PVDF reception array 62. A PCB sub-layer 63 provided between the arrays 61, 62 benefits the performance of the platelet device and also permits the reception array electrode pattern to be defined on the lower surface thereof by photolithographic etching techniques.

It will be clear to those of skill in the art that the above-described embodiments are merely exemplary of the present invention and that various modifications and improvements may be made thereto without departing from the scope of the invention.

We claim:

1. A flexible piezo-electric transducer comprising: a flexible substrate; a plurality of piezo-ceramic platelets carried by the substrate, the platelets having a width:height ratio between 10:1 and 5:1 and each platelet acting in a similar manner to a small thickness mode resonator; and an electrode array connected to the platelets whereby the individual responses of the respective platelets may be integrated together to provide a flexible material exhibiting the electro-mechanical properties of the parent piezo-ceramic.

2. The transducer of claim 1, wherein the platelets are formed of modified lead titanate.

3. The transducer of claim 1, wherein the piezo-ceramic platelets are embedded in the substrate.

4. A method of producing a flexible piezo-ceramic transducer, the method comprising:

providing a flexible substrate carrying a plurality of piezoceramic platelets, wherein the platelet dimensions are selected such the platelets collectively provide a flexible piezo-ceramic material possessing the electro-mechanical properties of the parent piezo-ceramic, wherein the platelet dimensions are selected to provide a width:height ratio of between 10:1 and 5:1.

5. The method of claim 4, wherein the piezo-ceramic platelets are embedded in the flexible substrate.

* * * * *